United States Patent [19]
Anderson

[11] Patent Number: 5,465,067
[45] Date of Patent: Nov. 7, 1995

[54] CURRENT CLAMPING CIRCUIT

[75] Inventor: David J. Anderson, Ahwatukee, Ariz.

[73] Assignee: Samsung Semiconductor, Inc., San Jose, Calif.

[21] Appl. No.: 242,203

[22] Filed: May 13, 1994

[51] Int. Cl.⁶ .................................................. H03K 5/08
[52] U.S. Cl. ........................ 327/322; 327/332; 327/77; 327/563; 330/253
[58] Field of Search ........................ 327/309, 312, 327/560, 563, 322, 332, 77, 321, 66, 67, 72, 73, 538, 543, 545, 546; 330/253, 257, 260

[56] References Cited

U.S. PATENT DOCUMENTS

| | | | |
|---|---|---|---|
| 4,484,089 | 11/1984 | Viswanathan | 327/543 |
| 4,644,198 | 2/1987 | Ahmed | 307/549 |
| 4,700,144 | 10/1987 | Thomson | 330/257 |
| 4,874,966 | 10/1989 | Gehrt et al. | 327/538 |
| 4,881,044 | 11/1989 | Kinoshita | 330/253 |
| 4,914,324 | 4/1990 | Goto | 307/546 |
| 4,992,852 | 2/1991 | Sekizawa et al. | 358/11 |
| 5,028,881 | 7/1991 | Jackson | 330/253 |
| 5,045,806 | 9/1991 | Yan | 330/253 |
| 5,065,056 | 11/1991 | Imai et al. | 307/540 |
| 5,184,087 | 2/1993 | Kim | 330/253 |
| 5,206,728 | 4/1993 | Kim | 358/168 |

*Primary Examiner*—Timothy P. Callahan
*Assistant Examiner*—Terry L. Englund
*Attorney, Agent, or Firm*—Skjerven, Morrill, MacPherson, Franklin & Friel; Mark P. Kahler

[57] ABSTRACT

A current clamping circuit is provided which clamps a current signal to a predetermined reference current level. An input current signal and a reference current signal are supplied to the clamping circuit. The clamping circuit includes a current differencing device which determines the difference between the input current signal and the reference current signal. This current difference is summed with the original input current signal or a mirror thereof at a summing node to produce an output signal which is clamped at the predetermined reference current level.

16 Claims, 5 Drawing Sheets

FIG. 4                    200
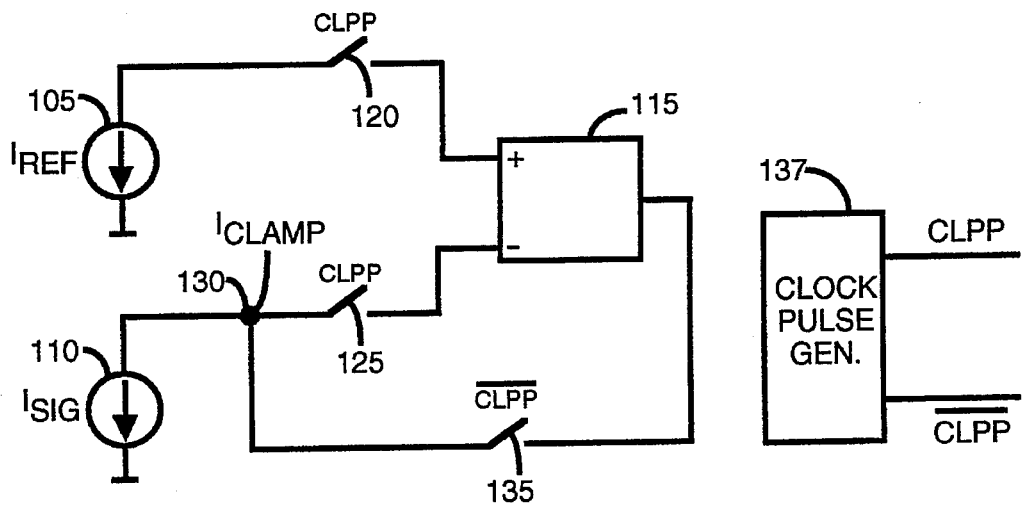
FIG. 5A
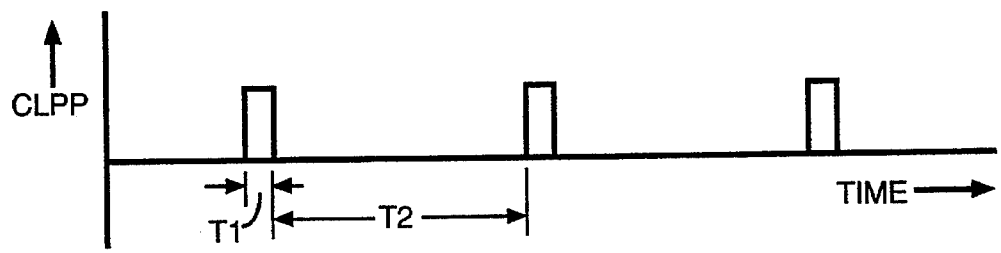
FIG. 5B
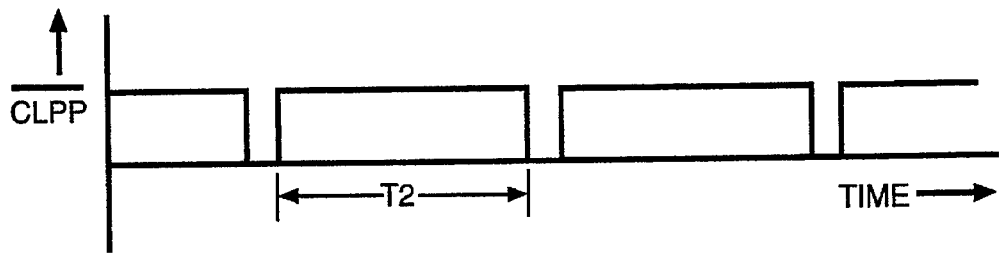

CURRENT CLAMPING CIRCUIT

BACKGROUND OF THE INVENTION

1. Field of the Invention

This invention relates in general to clamping circuits for clamping a signal at a predetermined reference level and, more particularly, to a clamping circuit for clamping a signal at a predetermined current level.

2. Description of Related Art

In television applications it is often desirable that the peak variations of the television signal, namely the tips of the sync signal, be clamped to a reference voltage potential called the "sync tip clamping level". This serves to prevent overmodulation or undermodulation of the television signal on a radio frequency carrier by placing the television signal excursions within a known range of voltage values.

One typical clamping circuit is disclosed in U.S. Pat. No. 4,914,324, issued to Goto, and is shown in FIG. 1A as clamping circuit 10. Clamping circuit 10 includes differential amplifiers 15 and 20 which are connected in a loop. An FET switch 25 completes the path which joins amplifiers 15 and 20. A holding capacitor 30 is coupled between one side of FET switch 25 and ground. An input voltage signal, $V_{SIGNAL}$, is provided to the non-inverting input of amplifier 15 and an output signal, $V_{OUT}$, is observed at the output of amplifier 15. A voltage reference signal $V_{REF}$ is provided to the inverting input of amplifier 20. Clamping circuit 10 acts to clamp the input voltage $V_{SIGNAL}$ to the $V_{REF}$ voltage reference signal to produce a clamped output voltage $V_{OUT}$.

The operation of clamping circuit 10 is now briefly discussed with reference to the voltage vs. time graph, $V_{OUT}$ vs. TIME, shown in FIG. 1B. When FET switch 25 is turned on at time T1, a difference voltage between the $V_{OUT}$ output voltage and the $V_{REF}$ reference voltage is fed back to the inverting input of differential amplifier 15. The difference between $V_{OUT}$ output voltage and the $V_{REF}$ reference voltage is applied to the inverting input of differential amplifier 15 to correct the $V_{OUT}$ output voltage level. In this manner, the output voltage $V_{OUT}$ becomes clamped to a definite voltage which is equal to reference voltage $V_{REF}$ in this example. The output of differential amplifier 20 is held by a holding or smoothing capacitor 30 such that the clamping state is maintained.

FIG. 2 shows a video signal 50 both prior to clamping to a voltage reference $V_{REF}$ and after such clamping. More specifically, video signal 50 includes a video line 55 which is unclamped and a video line 60 which is clamped at $V_{REF}$. As Seen in FIG. 2, the sync tip 65 of video line 55 is below the $V_{REF}$ reference voltage, thus signifying that video line 55 is unclamped. In contrast, the sync tip 70 of video line 60 is at a value equal to the $V_{REF}$ reference voltage, thus signifying that video line 60 is clamped. Clamping of the sync tip to a reference level is often used in consumer television products such as video camcorders, whereas commercial television products often clamp the backporch region of the video signal to a voltage reference signal.

Most conventional clamping circuits deal with signals in terms of voltages and utilize capacitors and diodes to operate. For example, one such conventional clamping configuration is depicted in FIG. 3 as clamping circuit 100. Clamping circuit 100 performs DC restoration of an AC coupled signal, ie., a capacitively coupled signal. Clamping circuit 100 includes an input capacitor, C, for coupling an input signal to a diode D. Many practical clamping circuits employ an amplifier to form a superdiode structure. Clamping circuits often place a switch between the diode and ground to gate the clamping action.

While clamping circuits which operate on voltage signals are well known, in certain applications it is also desirable to have a clamping circuit which operates on signals in terms of current, as opposed to voltage.

SUMMARY OF THE INVENTION

Accordingly, one advantage of the clamping circuit of the present invention is that the clamping circuit operates on current signals.

Another advantage of the clamping circuit of the present invention is that the clamping circuit clamps at a predetermined reference current level.

Still another advantage of the clamping circuit of the invention is the ability to operate at relatively low supply voltages.

In accordance with one embodiment of the present invention, a current clamping circuit is provided which includes a current signal input to which an input current signal is provided. The current clamping circuit also includes a reference current input to which a reference current signal is provided. The current clamping circuit further includes a current differencing device, coupled to the current signal input and the reference signal input, for determining the current difference between the input current signal and the reference current signal. The current differencing device includes an output at which the current difference between the input current signal and the reference current signal is generated. The current clamping circuit also includes a summing node, coupled to the output of the current differencing circuit, for summing the current difference with the input current signal to clamp the input current signal to the reference current signal.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIG. 4 is a block diagram of a simplified embodiment of the clamping circuit of the present invention.

FIG. 5A is a voltage vs. time diagram of the clamp pulse clock signal which drives the clamping circuit of FIG. 4.

FIG. 5B is a voltage vs. time diagram of the complement of the clamp pulse clock signal which drives the clamping circuit of FIG. 4.

DETAILED DESCRIPTION OF THE INVENTION

Figure 1A:
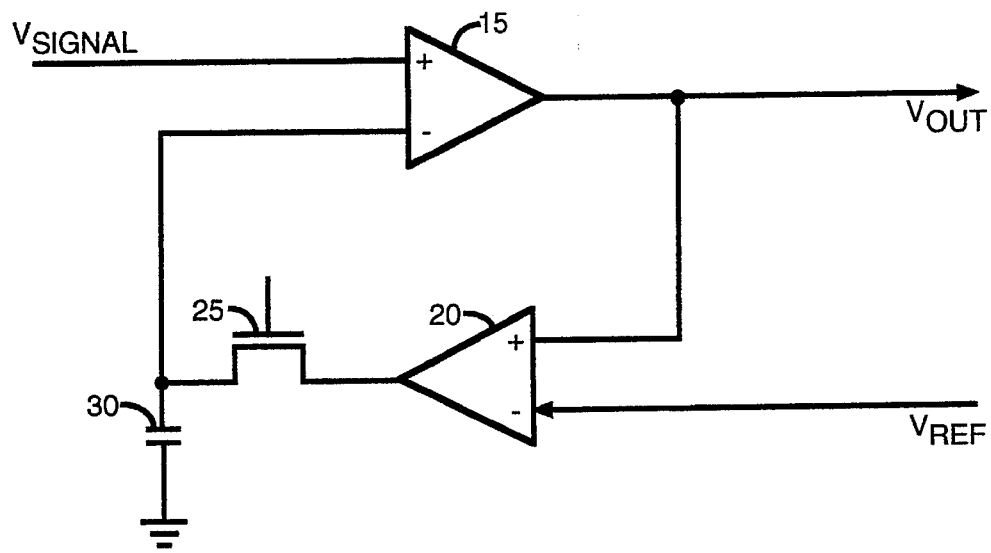
FIG. 1A is a block diagram of a conventional clamping circuit.
Figure 1B:
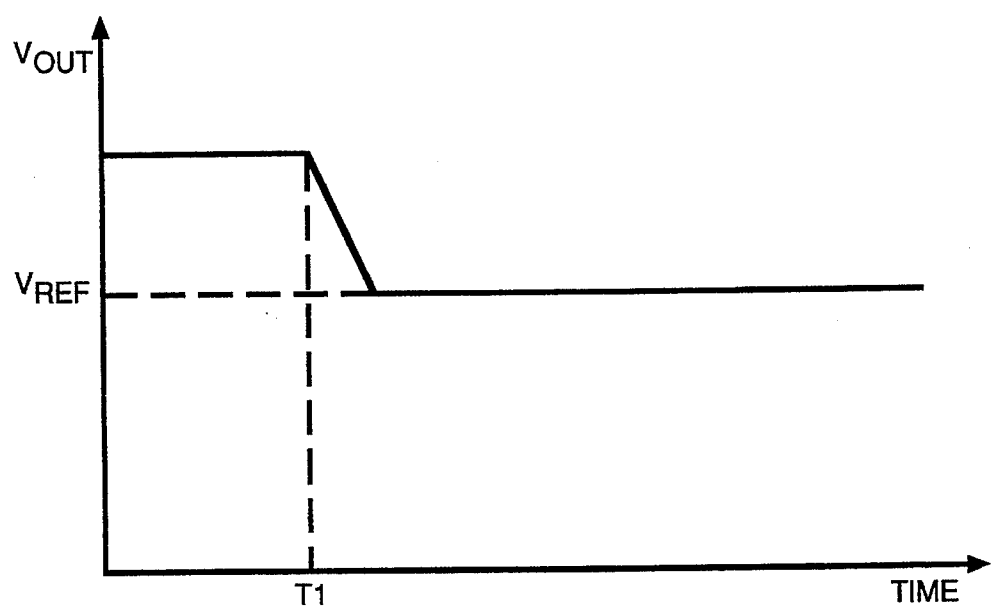
FIG. 1B is a voltage vs. time graph showing the clamping action achieved by the clamping circuit of FIG. 1A.
Figure 2:
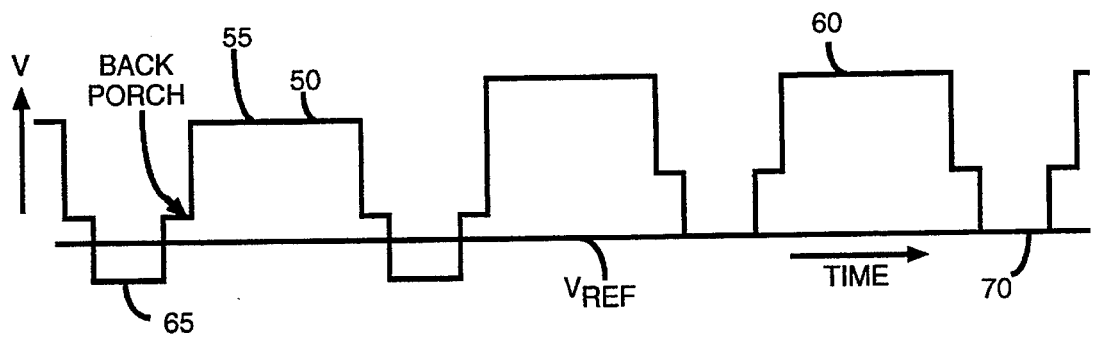
FIG. 2 is a voltage vs. time graph showing a video signal which includes an unclamped line and a clamped line.
Figure 3:
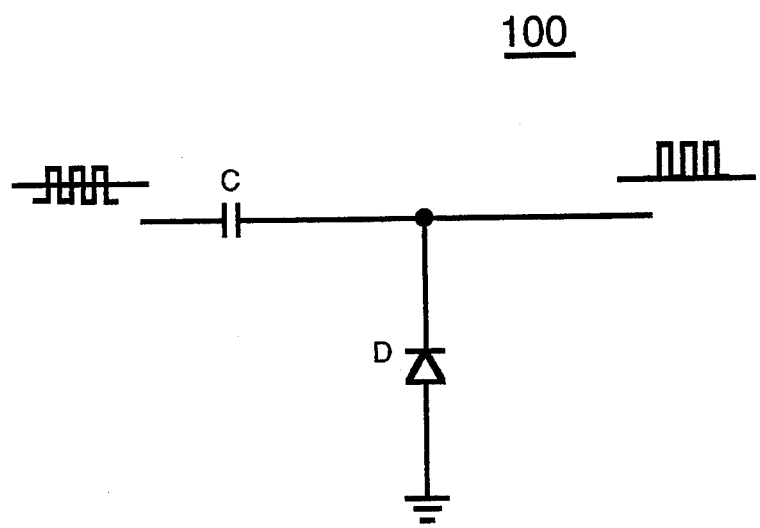
FIG. 3 is a block diagram of another conventional clamping circuit.

One embodiment of the clamping circuit of the present invention is shown in FIG. 4 as clamping circuit 200. Clamping circuit 200 is a current mode clamping circuit which is in contrast with voltage mode clamping circuits that are already known.

An unclamped current input signal, $I_{SIG}$, is supplied to clamping circuit 200. It is desired that this current signal, $I_{SIG}$, be clamped at a reference current level, $I_{REF}$, which is supplied to clamping circuit 200 as the $I_{REF}$ signal. For simplicity, the reference current signal, $I_{REF}$, is represented by a current source 105 and the unclamped current signal, $I_{SIG}$, is represented by a current source 110. One terminal of $I_{REF}$ current source 105 and one terminal of $I_{SIG}$ current source 110 are coupled to ground or a negative rail. The remaining terminal of $I_{REF}$ current source 105 is coupled to the non-inverting input of a current differencing circuit 115 via a switch 120 therebetween. A transconductance amplifier which outputs the difference between two input voltage signals may be employed as current differencing circuit 115 when used in the manner described herein. The remaining terminal of $I_{SIG}$ current source 110 is coupled to the inverting input of current differencing circuit 115 via a switch 125 therebetween.

Switches 120 and 125 close and open in accordance with a clamp pulse clock signal, CLPP, provided thereto. The clamp pulse clock signal, CLPP, is illustrated in FIG. 5A. In this particular embodiment, when CLPP is low, switches 120 and 125 are open. When CLPP is high, switches 120 and 125 are closed. Thus, switch 125 closes and opens in tandem with switch 120 in accordance with clamp pulse clock signal, CLPP.

A feedback path is established between the output of current differencing circuit 115 and a node 130 which is defined at the juncture of $I_{SIG}$ current source 110 and switch 125. A switch 135 is coupled in this feedback path between the output of current differencing circuit 115 and node 130. The complement of the CLPP clamp clock signal, namely /CLPP, is provided to switch 135 to control the switching action thereof. In this manner, when switches 120 and 125 are closed to permit sampling of the $I_{REF}$ and $I_{SIG}$ signals, respectively, switch 135 is open such that the feedback path is open. Conversely, when switches 120 and 125 are open and sampling has momentarily ceased in between the CLPP clamp clock signal pulses, then switch 135 is closed to establish the feedback path. A clock pulse generator 137 generates the CLPP and /CLPP clamp clock signals.

To clamp the current signal, $I_{SIG}$, to the reference current level, $I_{REF}$, the difference in current level between these two signals is sampled by differencing circuit 115 during a first period of time, T1, as indicated in FIG. 5A. The resultant current difference is output by circuit 115 for a hold time, T2, or until the next CLPP clamp clock pulse as indicated in FIG. 5B taken together with FIG. 5A. During the T2 time period established by /CLPP, this current difference is summed with the current signal, $I_{SIG}$, to alter the current level of the $I_{SIG}$ current signal such that it becomes clamped to the reference current level, $I_{REF}$. The resultant clamped signal, $I_{CLAMP}$, is produced at node 130 which is the summation point of the input current signal, $I_{SIG}$, and the current difference from the output of differencing circuit 115. The difference current signal either adds to or subtracts from the $I_{SIG}$ input current signal to form clamped signal, $I_{CLAMP}$, at summation node 130.

Figure 6:
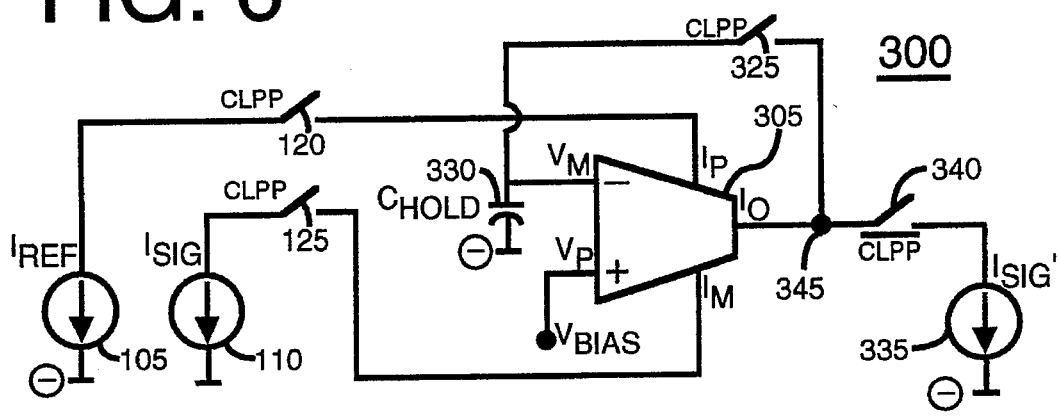
FIG. 6 is a more detailed implementation of the clamping circuit of the present invention.

FIG. 6 shows a more detailed implementation of the clamping circuit of the present invention as clamping circuit 300. Clamping circuit 300 of FIG. 6 is similar to clamping circuit 200 of FIG. 4 with like components being designated by like numerals. In clamping circuit 300, a transconductance amplifier 305 is employed as the current differencing circuit which determines the difference between the $I_{REF}$ and $I_{SIG}$ signals that are provided to the $I_P$ and $I_M$ current inputs, respectively, thereof.

Figure 7A:
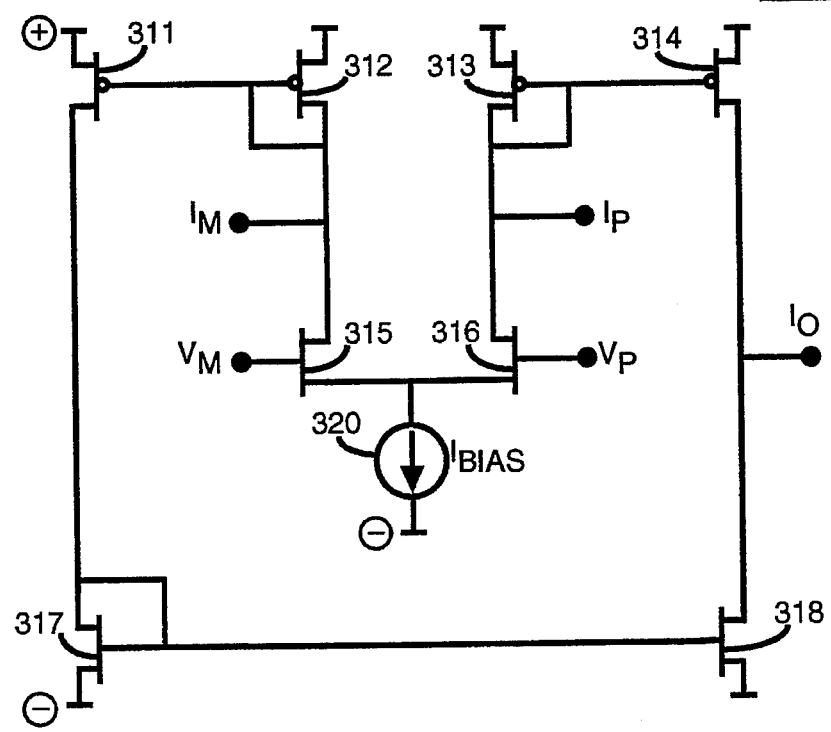
FIG. 7A is a schematic diagram of a transconductance amplifier that may be employed in the clamping circuit of FIG. 6.

One transconductance amplifier which can be used as transconductance amplifier is shown schematically in FIG. 7A as transconductance amplifier 305. Other transconductance amplifiers may be employed as transconductance amplifier 305 as well. Transconductance amplifier 305 includes P channel FETs 311, 312, 313, 314 and N channel FETs 315, 316, 317, 318, all connected together as shown in FIG. 7A. The sources of FETs 311, 312, 313 and 314 are coupled to a positive voltage rail. The gates of FETs 311 and 312 are coupled together and the gates of FETs 313 and 314 are coupled together. The drains of FETs 312 and 313 are coupled to the gates of FETs 312 and 313, respectively, and further to the drains of FETs 315 and 316, respectively. The juncture of the drain of FET 312 and the drain of FET 315 forms a current input $I_M$. The juncture of the drain of FET 313 and the drain of FET 316 forms a current input $I_P$. The gate of FET 315 is the voltage input, $V_M$, of amplifier 305. The gate of FET 316 is the voltage input, $V_P$, of amplifier 305. A current source 320, designated as $I_{BIAS}$, is coupled between the juncture of the sources of FETs 315, 316 and a negative voltage rail. A typical value of $I_{BIAS}$ current is 50 µA while values of 20 µA through 200 µA are also representative.

Figure 7B:
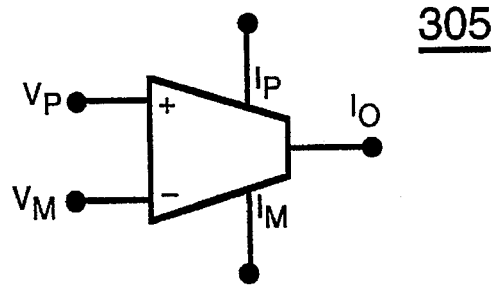
FIG. 7B is a compact notation for the transconductance amplifier of FIG. 7A.

The sources of FETs 317, 318 are coupled to the negative voltage rail and the gates thereof are coupled together. The drains of FETs 317 and 318 are coupled to the drains of FETs 311 and 314, respectively. The drain and gate of FET 317 are coupled together as shown. The drain and gate of FET 318 are also coupled together. A more convenient and compact notation for transconductance amplifier is shown in FIG. 7B.

Returning to FIG. 6, it is seen that the $I_{REF}$ reference current signal and the $I_{SIG}$ current signal are coupled via switches 120 and 125 to the $I_P$ and $I_M$ inputs, respectively, of transconductance amplifier 305. The output, $I_O$, of amplifier 305 is coupled back to the $V_M$ input of amplifier 305 via a switch 325. The clamping pulse clock signal, CLPP, is provided to switches 120, 125 and 325 such that these switches are open when the CLPP signal is low and these switches are closed when the CLPP signal is high. The $V_M$ input of amplifier 305 is coupled to a negative rail by a holding capacitor 330. The $V_P$ input of amplifier 305 is coupled to a positive voltage source $V_{BIAS}$. The $V_{BIAS}$ voltage sets the nominal value of $V_M$ which is present at the inverting input of transconductance amplifier 305. The change in output current, $\Delta I_O$, modifies $V_M$ from the normal value of $V_{BIAS}$ according to the relationship, $\Delta V_M = \Delta I_O / g_m$, wherein $g_m$ is the transconductance of amplifier 305. A nominal value of $V_M$ is approximately halfway between the positive and negative supply rails, or 1.5 volts in a 3 volt system for example.

The output current of transconductance amplifier 305, $I_O$, is summed at node 345 with the current signal, $I_{SIG}'$, represented by current source 335. More particularly, the output of amplifier 305 is coupled to current source 335 by a switch 340. The $I_{SIG}'$ current source 335 is a current source which tracks the current represented by $I_{SIG}$ current source 110. For example, a current mirror can be used to form current sources 335 and 110 such that the $I_{SIG}'$ current equals the $I_{SIG}$ current and changes in the $I_{SIG}$ current are mirrored by changes in the $I_{SIG}'$ current. A /CLPP signal depicted in FIG. 5B is supplied to switch 340 to control the switching action of switch 340. When /CLPP is low, switch 340 is open and the $I_{REF}$ and $I_{SIG}$ current signals are sampled by transconductance amplifier 305. However, when /CLPP is high, switch 340 is closed and the output of amplifier 305 is coupled to $I_{SIG}'$ source 335. Thus, when /CLPP is high, the output current $I_O$, which represents the difference between $I_P$ and $I_M$, is summed with the $I_{SIG}'$ current signal at node 345. In this manner, the current signal at node 345 is clamped to the $I_{REF}$ signal.

The operation of clamping circuit 300 is now discussed in more detail. Transconductance amplifier 305 provides a measurement of the difference between the reference current, $I_{REF}$, and the signal current, $I_{SIG}$, during the high clamp clock signal pulses, CLPP, of FIG. 5A. The $I_{SIG}$ and $I_{REF}$ signals are effectively sampled during the time, T1, and the difference current, $I_O$, between these two current signals is determined by amplifier 305. Holding capacitor 330 assists in reproducing this difference current for the duration of the hold period T2 between the CLPP pulses. In other words, the difference current is effectively stored by capacitor 330 which acts as a storage device. Thus, a current is stored as a $g_m*V$ term. In other words, capacitor 330 stores a voltage which is a function of the transconductance of amplifier 305 such that the difference current is provided output.

The /CLPP waveform of FIG. 5B sets the T2 hold time during which the value $\Delta V_M$ is applied to input $V_M$. The capacitance of capacitor 330 is selected to be sufficiently large to prevent leakage current from significantly deteriorating the $\Delta V_M$ value which is fed back to input $V_M$ during the T2 hold time. For example, in one embodiment of the invention, a capacitance value, $C_{HOLD}$, equal to approximately 15 pF is sufficient. A typical value for the T1 duration of the CLPP pulse is 2 μsec which corresponds to half of a video sync tip period. A typical value for the T2 duration of the /CLPP pulse is 64 μsec which corresponds to one full horizontal video waveform. It is noted that the above provided values are for a particular application and are given for purposes of example. They should not be regarded as limiting. The actual values used in the current clamping circuit will depend on the particular application. During the hold period, T2, when switch 340 closes, the difference current at the output of amplifier 305 is summed with the signal current, $I_{SIG}'$, at node 345. In this manner, the DC current level of the input current signal, $I_{SIG}$, is corrected to achieve clamping action.

It is noted that amplifier 305 is connected as a follower with a bias voltage, $V_{BIAS}$, connected to the noninverting terminal thereof. A feedback loop is established between the output of amplifier 305 and the inverting input thereof. The inverting terminal of amplifier 305 maintains a voltage thereon such that transconductance amplifier 305 neither sources nor sinks current.

Since $V_P-V_M$ is stored on holding capacitor 330, when the input currents $I_P$ and $I_M$ are removed by the opening of switches 120 and 125, the output current ($I_O$) of amplifier 305 equals $I_M$ minus $I_P$, ($I_O=I_P-I_M$). This output current ($I_O$) is thus the difference current which is summed with the $I_{SIG}'$ signal current at node 345 during holding period, T2, when switch 340 closes.

Another embodiment of the invention employs MOSFET or bipolar supermirrors to minimize base current errors in the clamping circuit. For example, a supermirror may be used in the current source, $I_{SIG}$. Moreover, transconductance amplifier 305 can employ cascaded devices to increase output impedance and thus current accuracy.

Figure 8:
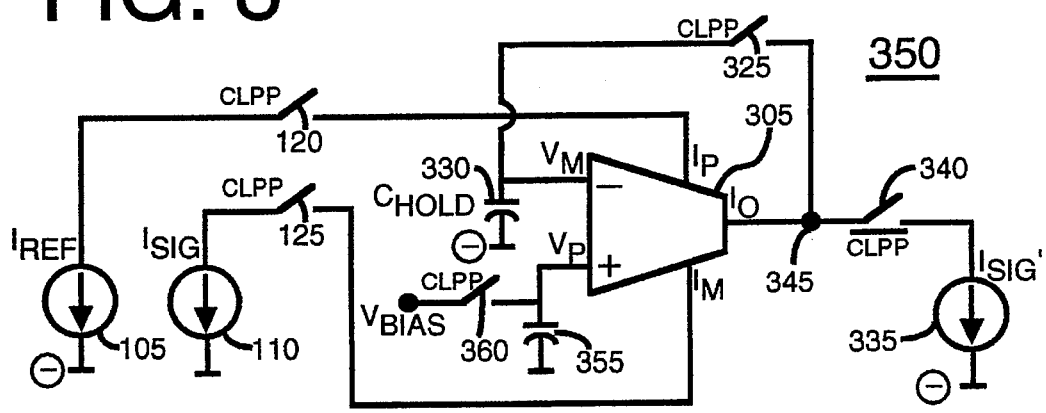
FIG. 8 is a schematic diagram of the clamping circuit of FIG. 6 which has been modified to include matching capacitors and switches.

In another embodiment of the invention depicted in FIG. 8 as clamping circuit 300, the voltage inputs of transconductance amplifier 305 use matching capacitors 330, 355 and switches 325, 360 to minimize charge injection and delays in the CLPP pulses. Switches 325, 360 can be used to divert current from transconductance amplifier 305 to the supply rail rather than open circuiting a current mirror when a current mirror is employed as current sources 110 and 335. Both switches 325, 360 close and open at the same time. When these switches open, the charge injection at the inverting input of amplifier 305 is matched at the non-inverting terminal of the amplifier and becomes a common mode signal which the amplifier can reject.

Figure 9:
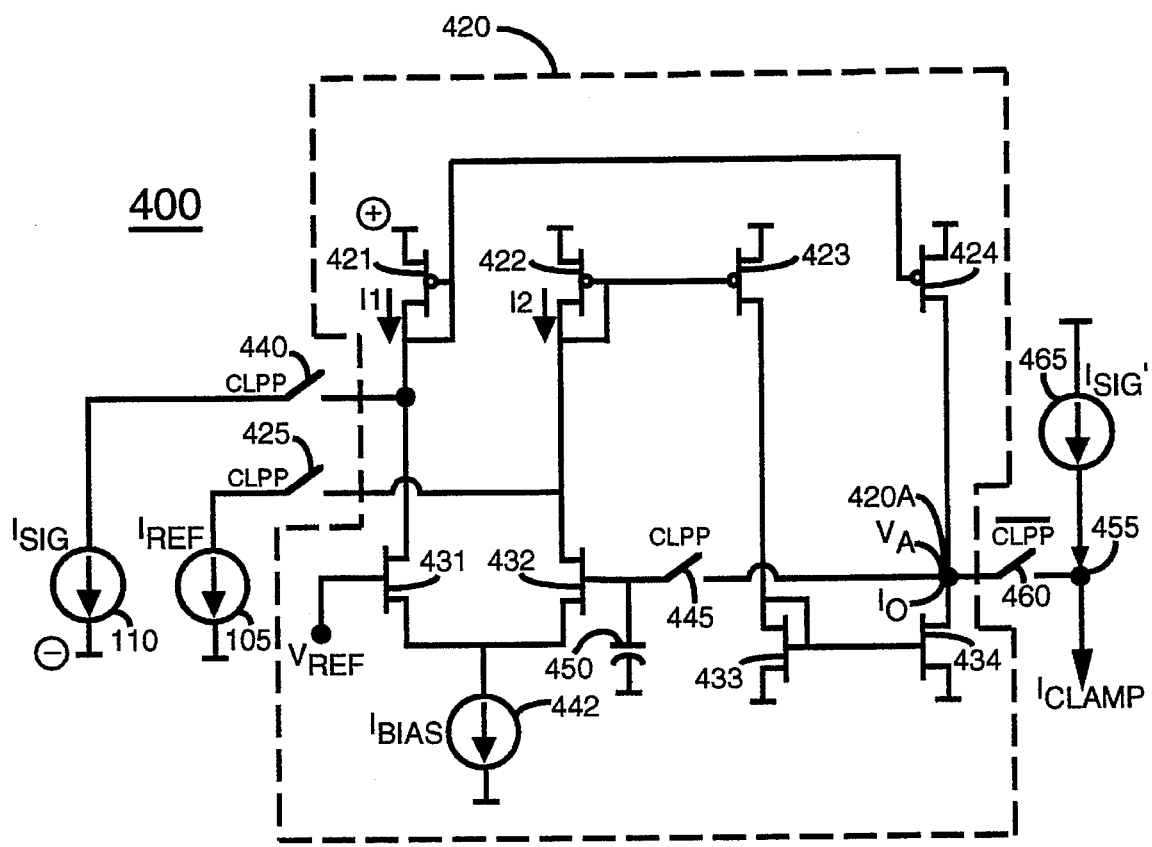
FIG. 9 is a schematic diagram of another embodiment of the clamping circuit of the present invention.

Another implementation of the invention is shown in FIG. 9 as clamping circuit 400. Clamping circuit 400 includes input signal current source 110 which represents the input current signal, $I_{SIG}$, that is to be clamped at a reference current level, $I_{REF}$. Clamping circuit 400 includes reference current source 105 which produces an output current at the desired reference current level, $I_{REF}$. A Current differencing circuit 420 such as a transconductance amplifier is situated in clamping circuit 400 as shown in FIG. 9.

Differencing circuit 420 includes P channel MOSFETs 421, 422, 423 and 424 and N channel FETs 431, 432, 433 and 434 which are coupled together as shown in FIG. 9. The sources of P channel MOSFETs 421, 422, 423 and 424 are coupled to a positive voltage rail. The sources of N channel FETs 433 and 434 are coupled to the negative rail. The sources of N channel FETs 431 and 432 are coupled to the negative rail via $I_{BIAS}$ current source 442. The drains of FETs 421 and 431 are coupled together and to $I_{SIG}$ current source 110 via switch 440 such that the signal current, $I_{SIG}$, is provided to differencing circuit 420 under the control of the CLPP pulse clamp clock signal. The gate and drain of FET 422 are coupled together and to the gate of FET 423. $I_{REF}$ current source 105 is coupled via switch 425 to the juncture of the drain of FET 422 and the drain of FET 432 so that the reference current, $I_{REF}$, is provided thereto under control of the CLPP clamp clock signal.

The gate and drain of FET 421 are coupled together and to the gate of FET 424. The gate and drain of FET 422 are coupled together and to the gate of FET 423. The gate of FET 432 is coupled via switch 445 to the juncture of the drain of FET 424 and the drain of FET 434. A holding capacitor 450 is coupled between the gate of FET 432 and the negative rail. The output signal of amplifier 420 appears at output 420A which is formed at the juncture of the drains of FETs 424 and 434. The difference between the input currents $I_{REF}$ and $I_{SIG}$ appears at output 420A as a current difference signal. This current difference signal is provided to a summing node 455 via a switch 460 coupled between output 420A and summing node 455. The current signal, $I_{SIG}'$, represented by current source 465, is also provided to summing node 455 to generate the clamped signal, $I_{CLAMP}$, from the summation of the current difference signal and the $I_{SIG}'$ current signal.

The /CLPP clocking signal is provided to switch 460 such that switch 460 is open during the T1 duration of the CLPP clamp clocking and closed during the duration of the T2 holding period provided by holding capacitor 450. In this manner, the $I_{REF}$ and $I_{SIG}$ signals are effectively sampled during the high pulses of the CLPP signal (T1) to determine the current difference signal, and the current difference signal is summed with a mirror, $I_{SIG}'$, of the original signal, $I_{SIG}$, during the holding periods, T2. Holding capacitor 450 acts to hold the difference current signal relatively constant during the duration of the CLPP high T2 time periods. An output current signal, $I_{CLAMP}$, is thus provided at summing node 455 which is clamped to the $I_{REF}$ current level.

More particularly, the current difference $I_{REF}-I_{SIG}$ is effectively sampled during the high pulses of the CLPP clamp clock signal of FIG. 5A. From FIG. 9 it is seen that a feedback loop is established which is closed around output 420A. Since the feedback loop is closed around output 420A, the gain of amplifier 420 forces the voltage at output 420A ($V_A$) to be approximately equal to $V_{REF}$. (ie. current through FET 421, $\Delta I_{BIAS}$, is equal to the difference $V_A \cong V_{REF}$) This condition occurs when the change in $I_{BIAS}$ between the $I_{REF}$ and the $I_{SIG}$ signals (ie. $\Delta I_{BIAS}=I_{REF}-I_{SIG}$). The required bias level on FET 432 is then held on holding capacitor 450 during the hold time T2 of the/CLPP clamp clock pulses. This required bias level is the difference from $V_{REF}$ needed to set the current to $\Delta I_{BIAS}$ governed by the relationship $\Delta I_{BIAS}=g_m *$ bias level, wherein $g_m$ is the transconductance of amplifier 420. In clamping circuit 400, a typical value for $I_{BIAS}$ is 50 μA. A typical value of capacitance for capacitor 450 is 15 pF. Typical values for both $I_{SIG}$ and $I_{REF}$ are 50 uA.

During the T2 hold time, the input currents $I_{SIG}$ and $I_{REF}$ are no longer supplied to amplifier 420. Thus, output 420A exhibits a net current difference equal to $I_{REF}$ minus $I_{SIG}$. This current difference signal is summed with the $I_{SIG}'$ current signal at summing node 455 to generate an output signal which is clamped at the $I_{REF}$ current level.

While a current clamping circuit apparatus has been described above, it is clear that a method of current clamping has also been disclosed. Briefly, a method of clamping a current input signal to a reference current signal is disclosed which includes the step of generating clock signal pulses exhibiting first and second logic levels. The method also includes the step of supplying the current input current signal and the reference current signal to a current differencing device when a clock signal pulse exhibits the first logic level. The method further includes the step of determining, by the current differencing device, the current difference between the input current signal and the reference current signal when a clock signal pulse exhibits the first logic level. The method also includes the step of storing the current difference from the determining step to provide a stored current difference. The method further includes the step of summing the stored current difference with the current input signal when the clock signal pulse exhibits the second logic level to clamp the input current signal to the reference current signal.

The foregoing has described a current clamping circuit which advantageously operates on current signals as opposed to voltage signals. The current clamping circuit clamps an input current signal at a predetermined reference current level while operating at relatively low supply voltages such as 3 volts rail to rail, for example.

while only certain preferred features of the invention have been shown by way of illustration, many modifications and changes will occur. It is, therefore, to be understood that the present claims are intended to cover all such modifications and changes which fall within the true spirit of the invention.

What is claimed is:

1. A current clamping circuit comprising:

a current signal input terminal to which an input current signal is provided;

a reference current input terminal to which a reference current signal is provided;

a clock signal generator which generates a clock signal exhibiting first and second logic levels:

a current differencing circuit, coupled said clock signal generator and to the current signal input terminal and the reference signal input terminal, for determining the current difference between the input current signal and the reference current signal while the clock signal exhibits the first logic level, the current differencing device including an output terminal at which the current difference is generated; and a summing circuit, coupled said clock signal generator and to the output terminal of the current differencing circuit and to the current signal input terminal, for summing the current difference with the input current signal while the clock signal exhibits the second logic level to clamp the input current signal to the reference current signal.

2. The current clamping circuit of claim 1 wherein the current differencing device comprises a transconductance amplifier.

3. A current clamping circuit comprising:

a current signal input terminal to which an input current signal is provided;

a reference current input terminal to which a reference current signal is provided;

a clock pulse generator for generating a clock pulse signal exhibiting first and second logic levels;

a first switch coupled to the current signal input terminal and to the clock pulse generator so that the dock pulse signal controls the first switch;

a second switch coupled to the reference current input terminal and to the clock pulse generator so that the clock pulse signal controls the second switch;

a current differencing device including first and second current input terminals and an output terminal, the first and second current input terminals being coupled to the first and second switches such that when the clock pulse signal exhibits the first logic level the first and second switches couple the current signal input terminal and the reference signal input terminal to the first and second current input terminals of the current differencing device, respectively, a current difference signal thus being generated at the output terminal of the current differencing device which is the difference between the input current signal and the reference current signal;

storing means, coupled to the current differencing device to receive the current difference signal from the current difference device, for storing the current difference signal during times when the clock pulse signal exhibits the second logic level thus producing a stored current difference signal; and a summing node, coupled to the output terminal of the current differencing device and the current signal input terminal, at which the input current signal and the stored current difference signal are summed to produce a clamped signal.

4. The current clamping circuit of claim 3 wherein the storing means comprises a holding capacitor.

5. The current clamping circuit of claim 3 wherein the current differencing device comprises a transconductance amplifier.

6. A current clamping circuit comprising:

a transconductance amplifier including current input terminals, $I_P$ and $I_M$, and voltage input terminals $V_P$ and $V_M$, and an output terminal, $I_O$;

a reference current source which supplies a reference current signal;

a first input current signal source which supplies a first input current signal;

a second input current signal source which mirrors the first input current signal source to supply a second input current signal;

a first switch coupled between the reference current source and the $I_P$ current input terminal;

a second switch coupled between the first input current signal source and the $I_M$ current input terminal:

a clock signal generator, coupled to the first and second switches, for generating a clock pulse signal which exhibits first and second logic levels, the first and second switches closing when the clock pulse signal exhibits the first logic level, the amplifier in response producing a current difference signal at the output terminal, $I_O$, of the amplifier; and a third switch coupled between the output terminal, $I_O$, of the amplifier and the second input current signal source, the third switch being coupled to the clock signal generator such that the third switch is closed when the clock pulse signal exhibits the second logic level, so that the current difference signal is summed with the second input current signal to clamp the first input current signal to the reference current signal.

7. The current clamping circuit of claim 6 further comprising a summing node between the output, $I_O$, of the amplifier and the third switch.

8. The current clamping circuit of claim 6 further comprising a summing node between the third switch and the second input current signal source.

9. The current clamping circuit of claim 6 wherein the first and second switches decouple the reference current signal source and the first input current signal source from the amplifier when the clock signal exhibits the second logic level.

10. The current clamping circuit of claim 6 further comprising a fourth switch coupled between the output, $I_O$, of the amplifier and the $V_M$ input terminal of the amplifier to provide feedback therebetween when the clock signal exhibits the first logic state.

11. The current clamping circuit of claim 10 further comprising a storage capacitor coupled to the $V_M$ input terminal of the amplifier to store the current difference signal which is fed back to the $V_M$ input terminal.

12. The current clamping circuit of claim 11 further comprising a voltage bias source coupled to the $V_P$ input terminal of the amplifier.

13. A method of clamping an input current signal to a reference current signal comprising the steps of:

generating a clock signal exhibiting first and second logic levels;

determining the current difference between the input current signal and the reference current signal when the clock signal pulse exhibits the first logic level; and summing the current difference from the determining step with the input current signal while the clock signal exhibits the second logic level to generate a clamped signal.

14. A method of clamping an input current signal to a reference current signal comprising the steps of:

generating clock signal pulses exhibiting first and second logic levels;

supplying the input current signal and the reference current signal to a current differencing device when a clock signal pulse exhibits the first logic level;

determining, by the current differencing device, the current difference between the input current signal and the reference current signal when a clock signal pulse exhibits the first logic level;

storing the current difference from the determining step to provide a stored current difference; and summing the stored current difference with the input current signal when the clock signal pulse exhibits the second logic level to clamp the input current signal to the reference current signal.

15. A current clamping circuit comprising:

a current signal input terminal to which an input current signal is provided;

a reference current input terminal to which a reference current signal is provided;

clock signal generating means for generating a clock signal exhibiting first and second logic levels;

current difference determining means, coupled to the current signal input terminal and the reference current input terminal and to the clock signal generating means, for determining the current difference between the input current signal and the reference current signal when the clock signal exhibits the first logic level; and summing means, coupled to the clock signal generating means and the current signal input terminal and the current difference determining means, for summing the current difference with the input current signal while the clock signal exhibits the second logic level to generate a clamped signal.

16. A current clamping circuit comprising:

a current signal input terminal to which an input current signal is provided;

a reference current input terminal to which a reference current signal is provided;

clock signal generating means for generating a clock signal exhibiting first and second logic levels;

switching means, coupled to the current signal input terminal and the reference current input terminal and to the clock signal generating means, for permitting output of the input current signal and the reference current signal when the clock signal exhibits the first logic level;

current difference determining means, coupled to the switching means, for determining the current difference between the input current signal and the reference current signal when the clock signal exhibits the first logic level;

storing means, coupled to the current difference determining means, for storing the current difference to provide a stored current difference; and summing means, coupled to the clock signal generating means and the storing means and to the current signal input terminal, for summing the stored current difference with the input current signal while the clock signal exhibits the second logic level to generate a clamped signal.

* * * * *

UNITED STATES PATENT AND TRADEMARK OFFICE
CERTIFICATE OF CORRECTION

PATENT NO. : 5,465,067
DATED : November 7, 1995
INVENTOR(S) : David J. Anderson

It is certified that error appears in the above-identified patent and that said Letters Patent is hereby corrected as shown below:

In Column 8, line 10 after "coupled" insert --to--.

In Column 8, line 11 delete "to".

In Column 8, line 18 after "coupled" insert --to--.

In Column 8, line 19 delete "to".

In Column 8, line 37 delete "dock" and insert --clock--.

Signed and Sealed this

Sixteenth Day of July, 199

Attest:

BRUCE LEHMAN

Attesting Officer     Commissioner of Patents and Trademarks